(12) United States Patent
Kuo et al.

(10) Patent No.: US 8,153,455 B2
(45) Date of Patent: Apr. 10, 2012

(54) METHOD FOR ENHANCING LIGHT EXTRACTION EFFICIENCY OF LIGHT EMITTING DIODES

(75) Inventors: Ming-Teng Kuo, Taoyuan (TW);
Jang-Ho Chen, Taoyuan (TW);
Ching-Hwa Chang Jean, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 0 days.

(21) Appl. No.: 12/697,414

(22) Filed: Feb. 1, 2010

(65) Prior Publication Data
US 2011/0189802 A1 Aug. 4, 2011

(51) Int. Cl.
*H01L 21/00* (2006.01)
(52) U.S. Cl. .............. 438/22; 438/39; 257/E33.006
(58) Field of Classification Search .............. 438/39, 438/21, 47, 22; 257/E33.006, E33.032
See application file for complete search history.

(56) References Cited

U.S. PATENT DOCUMENTS 5,700,739 A * 12/1997 Chiang et al. .............. 438/655
2008/0303018 A1* 12/2008 Kim et al. .............. 438/45

* cited by examiner

*Primary Examiner* — Walter L Lindsay, Jr.
(74) *Attorney, Agent, or Firm* — Bacon & Thomas, PLLC

(57) ABSTRACT

A method for enhancing light extraction efficiency of a light emitting diode is disclosed. The method includes the steps of providing a light emitting diode including in sequence a substrate, a first layer of a first conduction type, an active layer, and a second layer of a second conduction type opposite to the first conduction type; growing a number of protrusions on at least one layer selected from the first layer, the active layer, and the second layer of the light emitting diode to form a patterned oxide layer for protecting the light emitting diode from etch; controlling height of the protrusions to achieve a predetermined etching depth of the light emitting diode; dry etching through a portion of the light emitting diode which is not protected by the patterned oxide layer to form a plurality of depressions on the light emitting diode; and removing the oxide layer from the selected layer. The light emitting diode is patterned so that more light beams can be emitted. Therefore, light extraction efficiency is enhanced.

13 Claims, 31 Drawing Sheets

METHOD FOR ENHANCING LIGHT EXTRACTION EFFICIENCY OF LIGHT EMITTING DIODES

FIELD OF THE INVENTION

The present invention relates to a method for enhancing light extraction efficiency of a light emitting diode. More particularly, the present invention relates to a method for enhancing light extraction efficiency of a light emitting diode by roughening the surfaces of the light emitting diode.

BACKGROUND OF THE INVENTION

Light emitting efficiency of a light emitting diode is dominated by its internal quantum efficiency and light extraction efficiency. Internal quantum efficiency relates to the light generated from an active layer. Light extraction efficiency is the ability that the light from the active layer emits to medium surrounded. With development of epitaxy technology, internal quantum efficiency can be up to 80%. However, light extraction efficiency is still low. For example, refraction index of GaN series materials is about 2.5. The air around them has refraction index of 1. Due to total reflection, the light extraction efficiency in the interface is only 10~12%.

In order to enhance light extraction efficiency, randomly etched cavities are formed on the surface of a transparent conductive layer. Therefore, most light beams from the active layer can emit out of the light emitting diode without being reflected. Alternatively, roughening a p-type layer can also achieve the same effect.

Generally, thickness of the top epitaxial structure of a GaN or AlGaInP series light emitting diode for generating red or yellow beams is larger than 5 μm. Hence, plasma or chemical etching can be applied to make the cavities or a two dimensional pattern. However, for other light emitting diodes generating blue, green or UV light beams, the top epitaxial structure is very thin (about 0.2 μm). If the external quantum efficiency needs to be improved to enhance light extraction efficiency, depth of the cavities should be at least 0.2 μm. Therefore, traditional surface roughening methods are not proper for this purpose.

Additionally, traditional etching roughening methods usually use photoresist as a mask. Due to low etching selectivity, these methods can not be used to make a desired etching depth. Not to mention a deeper depth. Therefore, it is not easy to pattern or roughen the light emitting diode. Moreover, while metallic materials, such as nickel, are used as a hot mask, a photoresist needs to be in advance spread on the light emitting diode before the hot mask is placed, such that manufacturing complexity and cost are increased.

Traditionally, surface roughening methods may create patterns having protrusions with distance therebetween over 2~3 um. This is disadvantageous for forming delicate patterns to improve light extraction efficiency. Moreover, traditional etching methods can only be used to roughen top surface of the light emitting diode and are not able to roughen the edges thereof.

In order to overcome the problems mentioned above, an improved method is disclosed in U.S. Pat. No. 6,551,936. Please see FIG. 1. It is for etching a pattern in a semiconductor material based on the formation of an InP grating mask on the semiconductor material. The formation of the InP grating mask involves the formation of a multi-layered structure on the semiconductor material with an etch-stop layer between two InP layers. A photoresist grating mask corresponding to the pattern to be etched in the semiconductor material is then formed on the top InP layer. Subsequently, a non-selective etch is used to penetrate the top InP layer, the etch-stop layer, and the lower InP layer. A suitable stripping solvent is then used to remove the photoresist followed by a selective etch to clear the remaining exposed InP material, remove contaminated material and to expose the underlying semiconductor material in accordance with the pattern to be etched. Additional masking beyond the InP mask is, therefore, not required. The exposed semiconductor material is then etched such that the pattern is transferred to the semiconductor material.

Although the above invention solves most of the problems, the pattern formed is still restricted. Not any desirable pattern for enhancing light extraction efficiency can be controlled and achieved.

SUMMARY OF THE INVENTION

In order to overcome the problems mentioned above, the present invention provides a method for enhancing light extraction efficiency by patterning a light emitting diode. An oxide layer is used instead of photoresist for etching process. Thickness of the oxide layer can be easily controlled, so that a desired etching depth of the light emitting diode can be achieved readily, and therefore, the light emitting diode can be patterned into any shape. In this way, the present invention has a simpler manufacturing process compared to the traditional manufacturing process, thereby saving time and cost.

In accordance with an aspect of the present invention, a method for enhancing light extraction efficiency includes the steps of: a) providing a light emitting diode including in sequence a substrate, a first layer of a first conduction type, an active layer, and a second layer of a second conduction type opposite to the first conduction type; b) growing a plurality of protrusions on at least one layer selected from the first layer, the active layer, and the second layer of the light emitting diode to form a patterned oxide layer for protecting the light emitting diode from etch; c) controlling height of the protrusions to achieve a predetermined etching depth of the light emitting diode; d) dry etching through a portion of the light emitting diode which is not protected by the patterned oxide layer to form a plurality of depressions on the light emitting diode; and e) removing the oxide layer from the selected layer.

Preferably, the first conduction type is n-type and the second conduction type is p-type.

Preferably, the active layer has a quantum well structure, a homojunction structure, or a heterojunction structure.

Preferably, the patterned oxide layer is formed by hydrothermal treatment, sol-gel method, electro-plating, thermal evaporation, chemical vapor deposition (CVD), or molecular beam epitaxy (MBE).

Preferably, the patterned oxide layer is made of indium tin oxide (ITO), al-doped zinc oxide (AZO), silicon dioxide ($SiO_2$), zinc oxide (ZnO), magnesium oxide (MgO), molybdenum oxide (MoO), aluminum oxide ($Al_2O_3$), titanium dioxide ($TiO_2$), nickel oxide (NiO), calcium oxide (CaO), barium oxide (BaO), manganese oxide (MnO), copper oxide (CuO), tin dioxide ($SnO_2$), or a mixture thereof Preferably, the protrusion has a shape of hexagonal pyramid, truncated hexagonal pyramid, or hexagonal cylinder.

Preferably, the patterned oxide layer is at least partially formed on a top surface or a side surface of the light emitting diode.

Preferably, the dry etching step is performed by plasma etching, inductively coupled plasma (ICP) etching, ion beam etching or reactive ion etching.

Preferably, the protrusions have a diameter ranging from 1 nm to 10 μm.

Preferably, the predetermined etching depth is achieved by controlling reaction time of the dry etching step.

Preferably, the present invention further comprises a step of d1) dry etching a portion of the oxide layer.

Preferably, the light emitting diode has a cross-sectional shape of wedge, rectangle or step.

Preferably, a distance between two adjacent protrusions is less than 1 micrometer.

Preferably, the removing step is performed by hydrochloric acid, nitric acid, or hydrogen peroxide.

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In order to have a full understanding of the present invention, eight embodiments are described below.

First Embodiment

Figure 1:
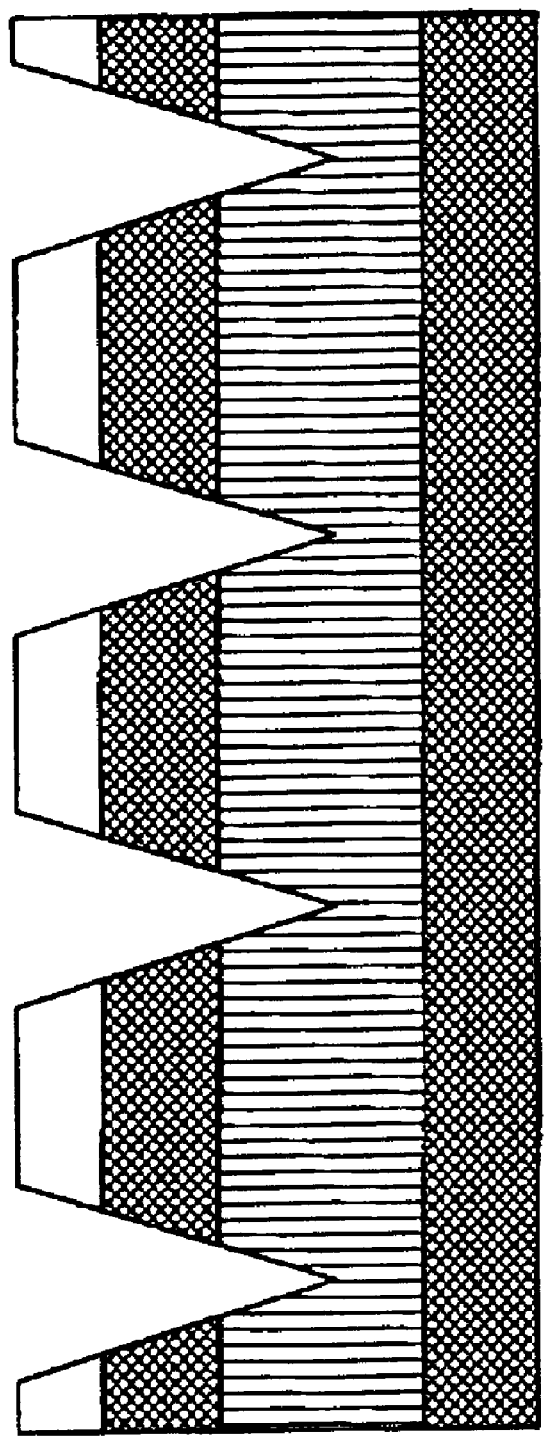
FIG. 1 shows a prior art light emitting diode.
Figure 2:
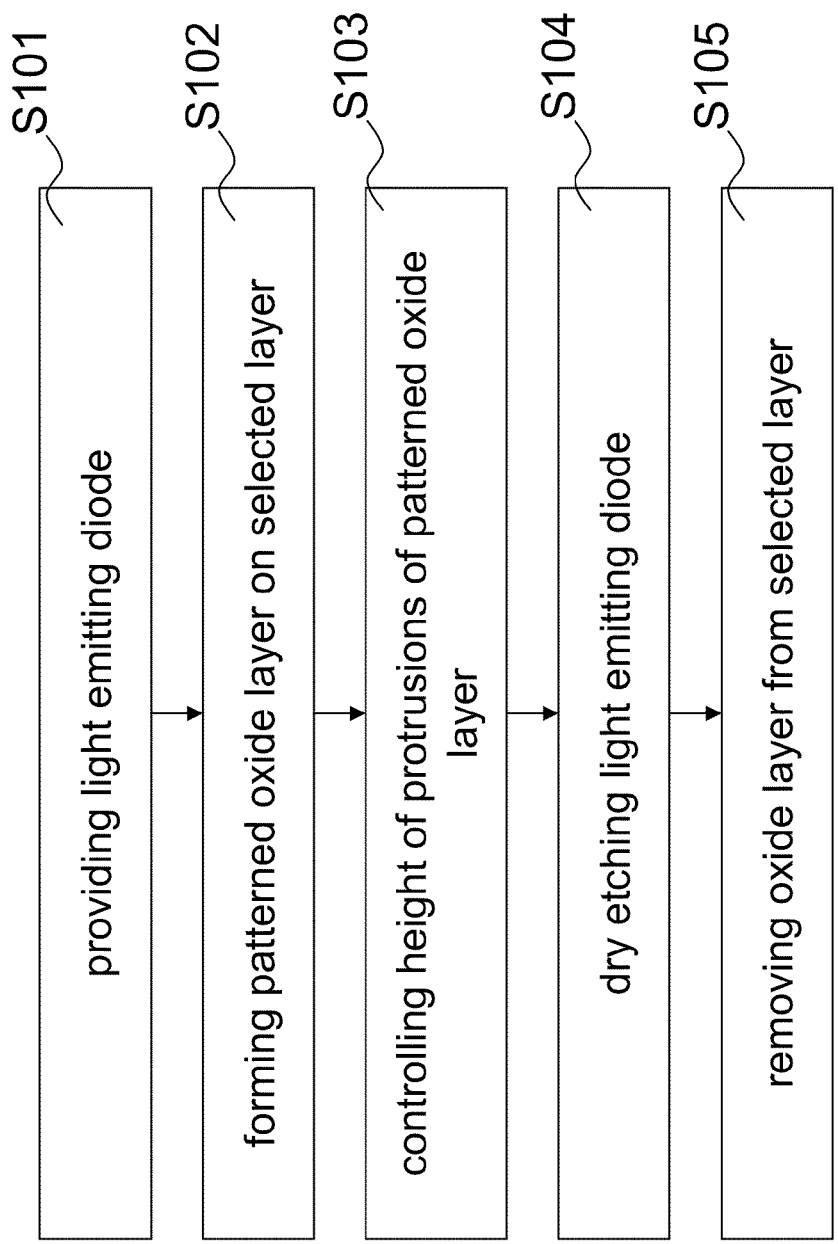
FIG. 2 is a flow chart of patterning a light emitting diode according to a first embodiment of the present invention.
Figure 3A:
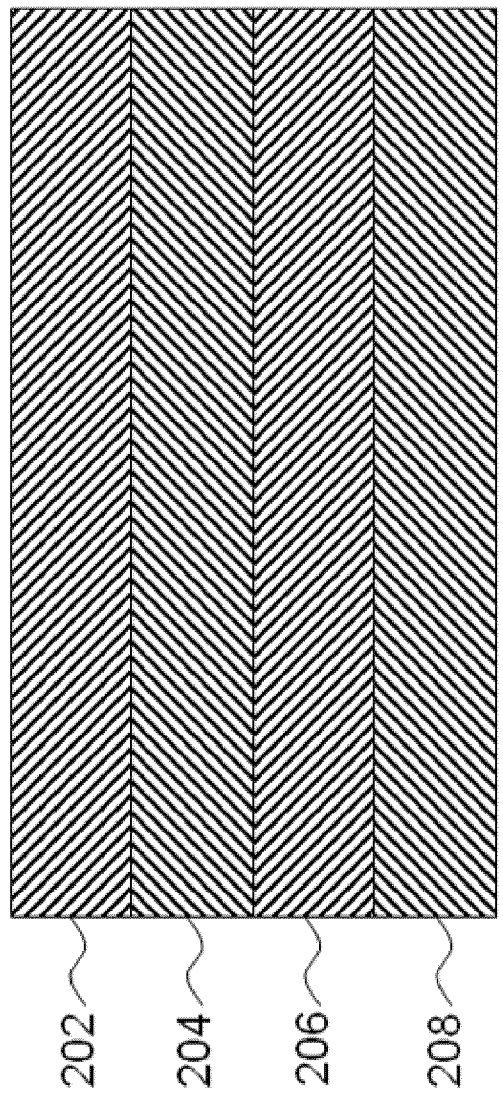
FIGS. 3A-3D illustrate a manufacturing process for patterning a light emitting diode according to the first embodiment of the present invention.
Figure 3B:
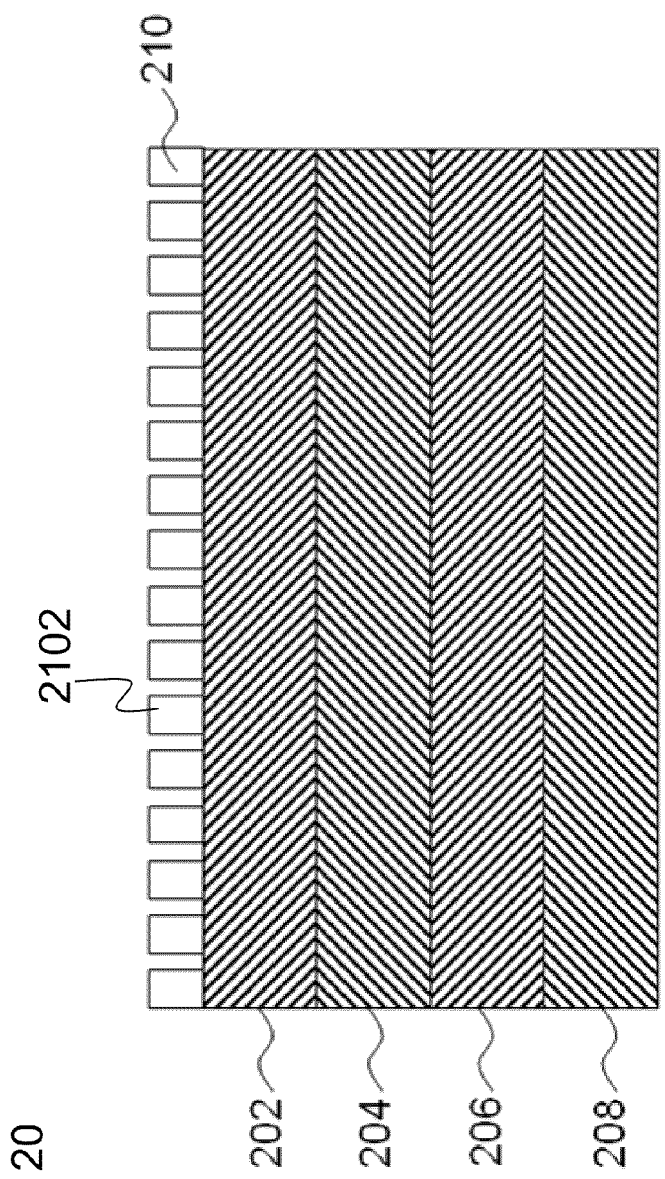
Figure 3C:
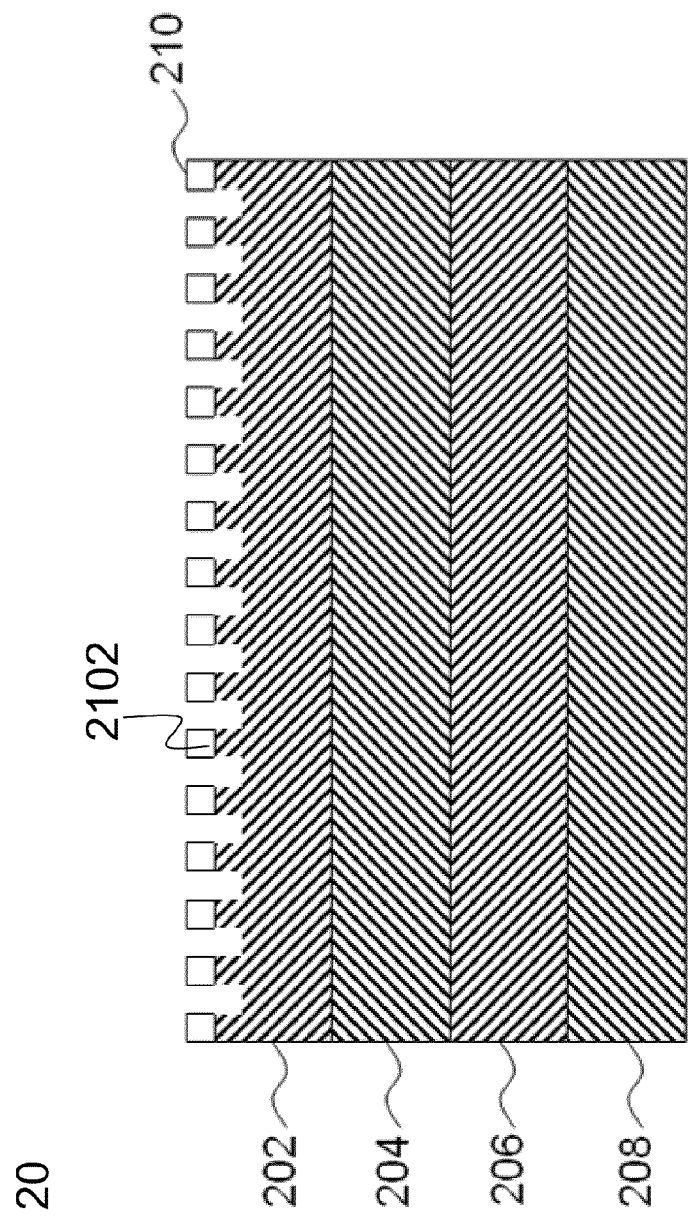
Figure 3D:
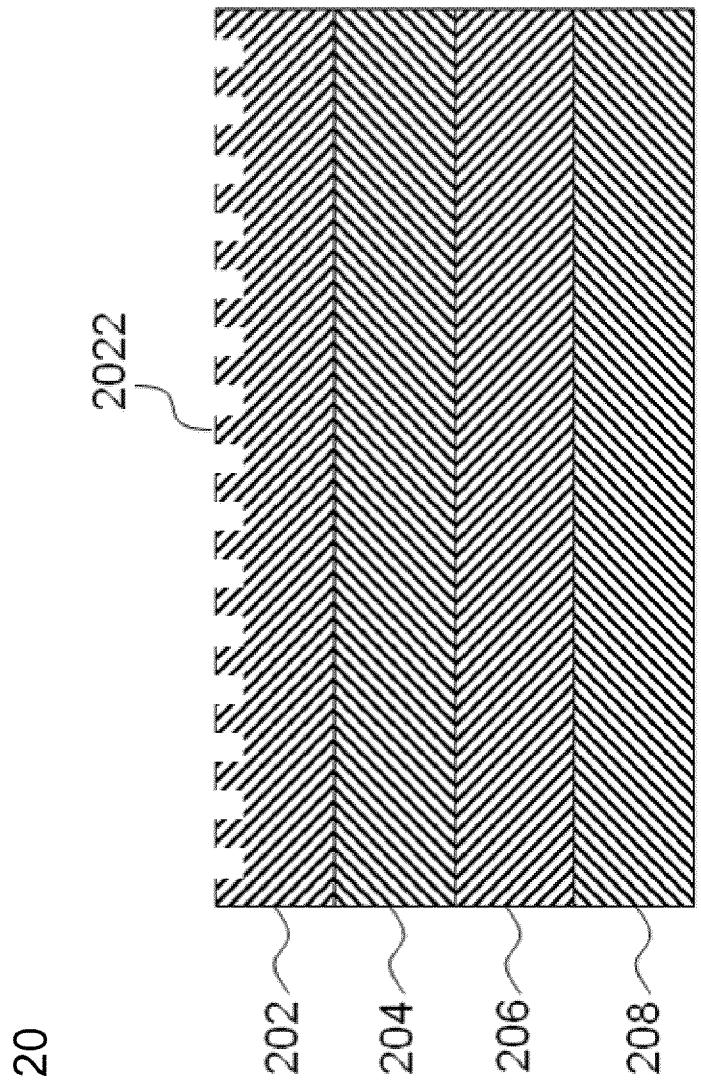
Figure 4A:
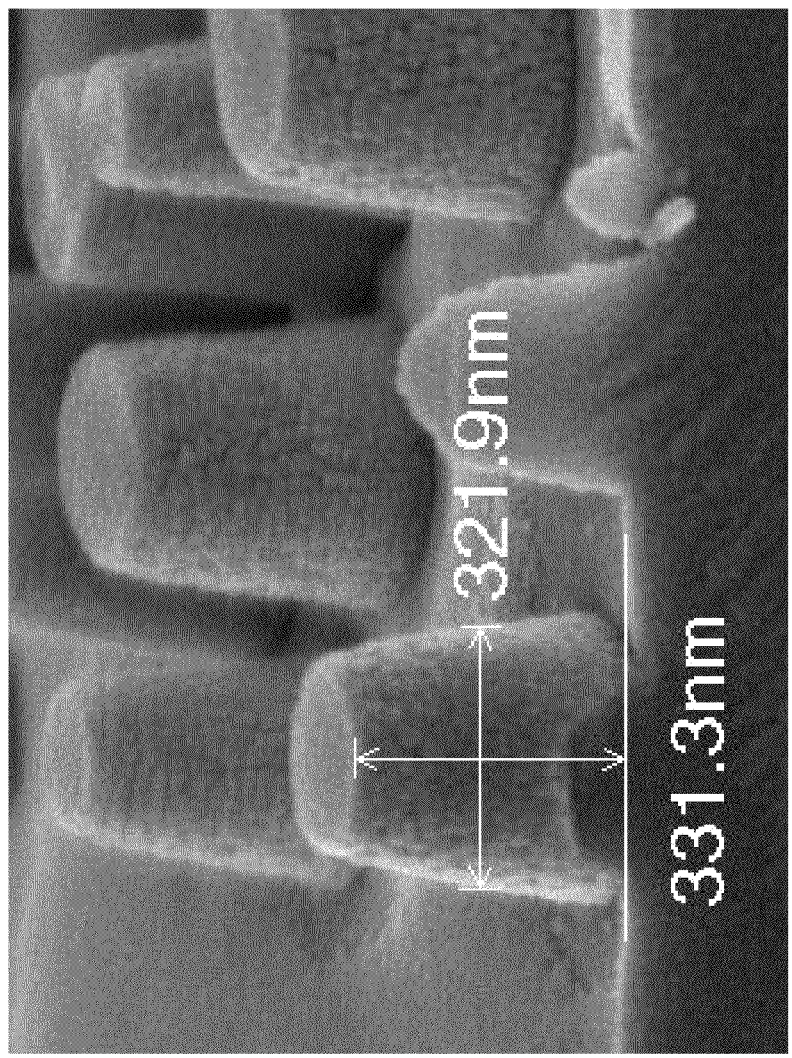
FIGS. 4A-4D illustrate scanning electron microscope (SEM) images showing different shapes of protrusions on the light emitting diode.
Figure 4B:
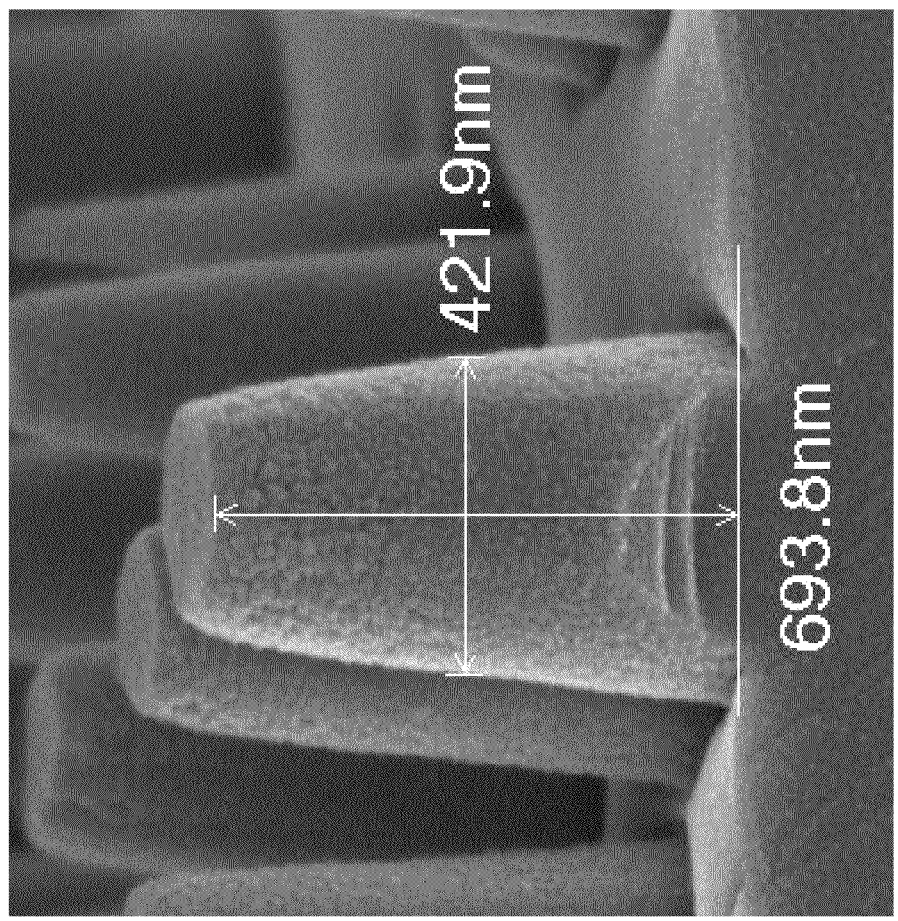
Figure 4C:
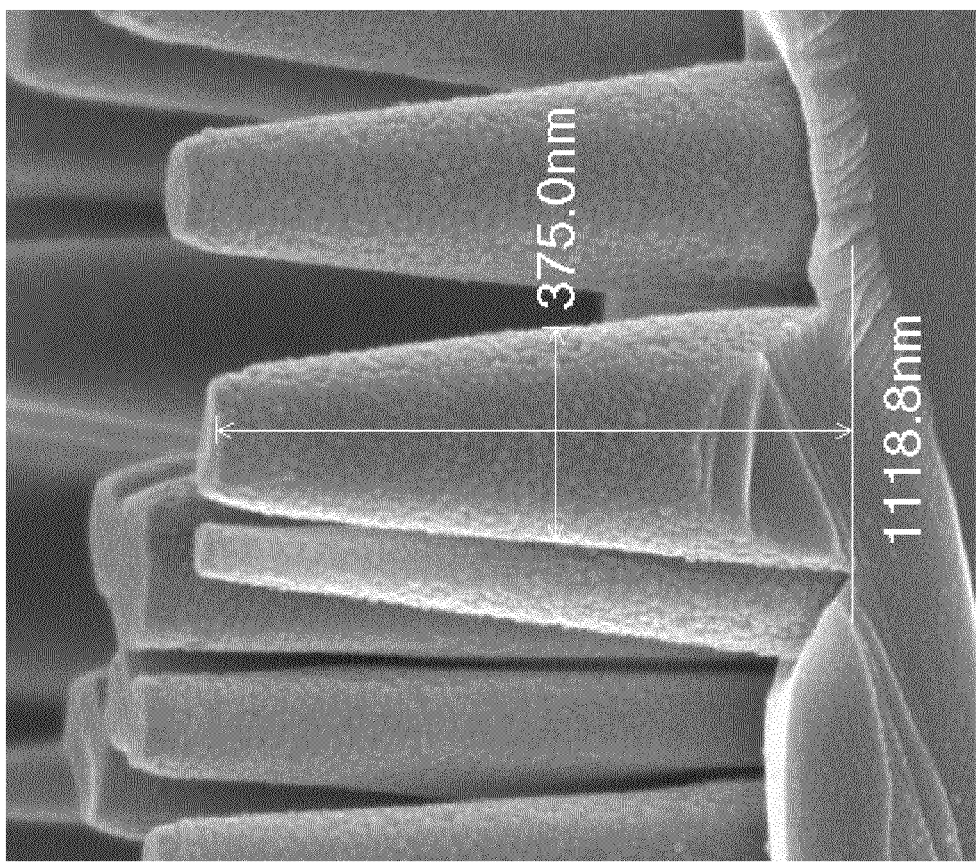
Figure 4D:
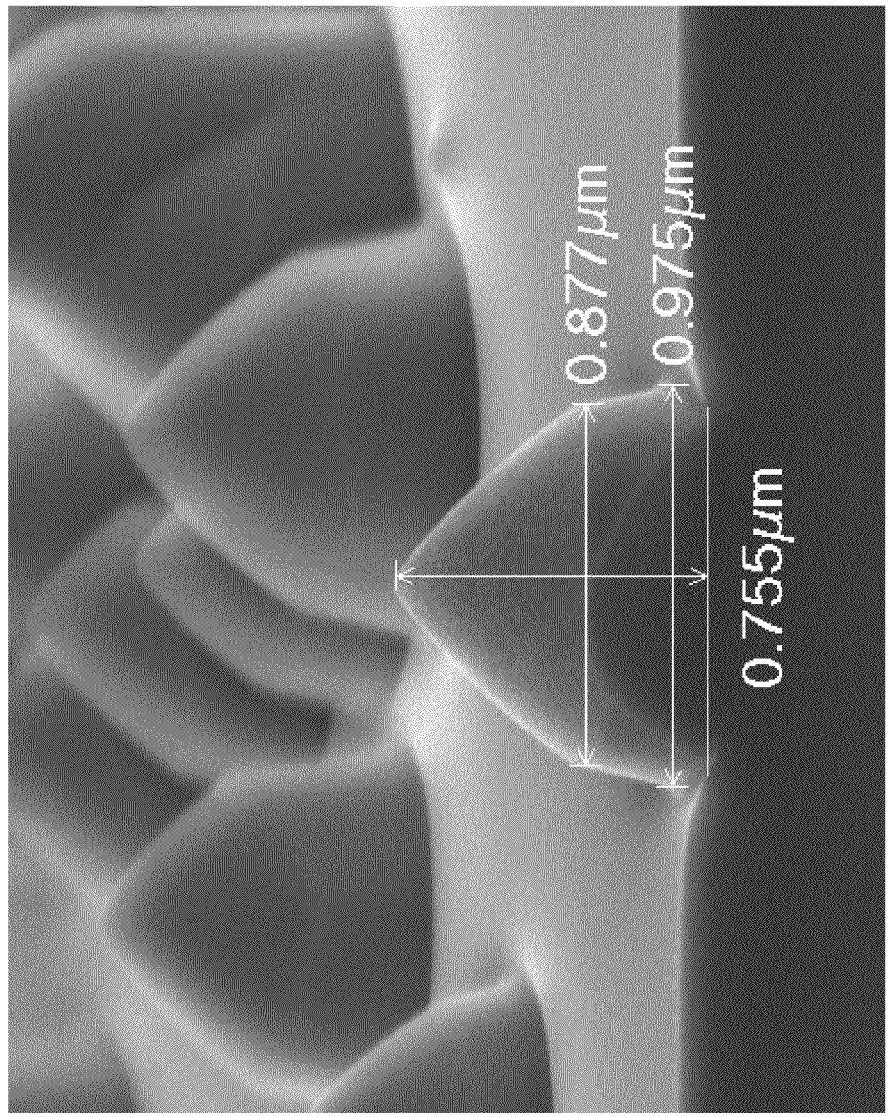
Figure 5:
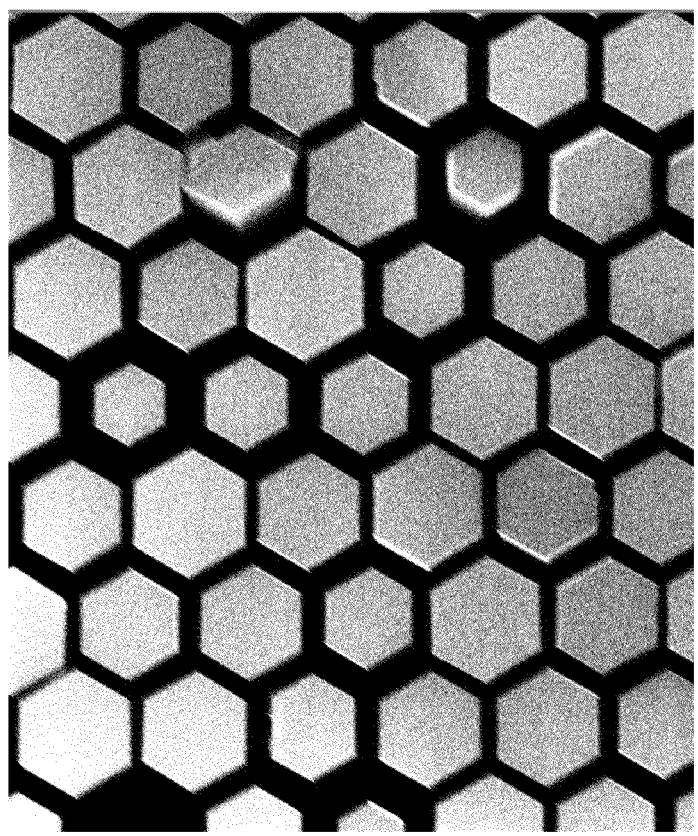
FIG. 5 shows a top view of the etched light emitting diode according to the first embodiment of the present invention.
Figure 6A:
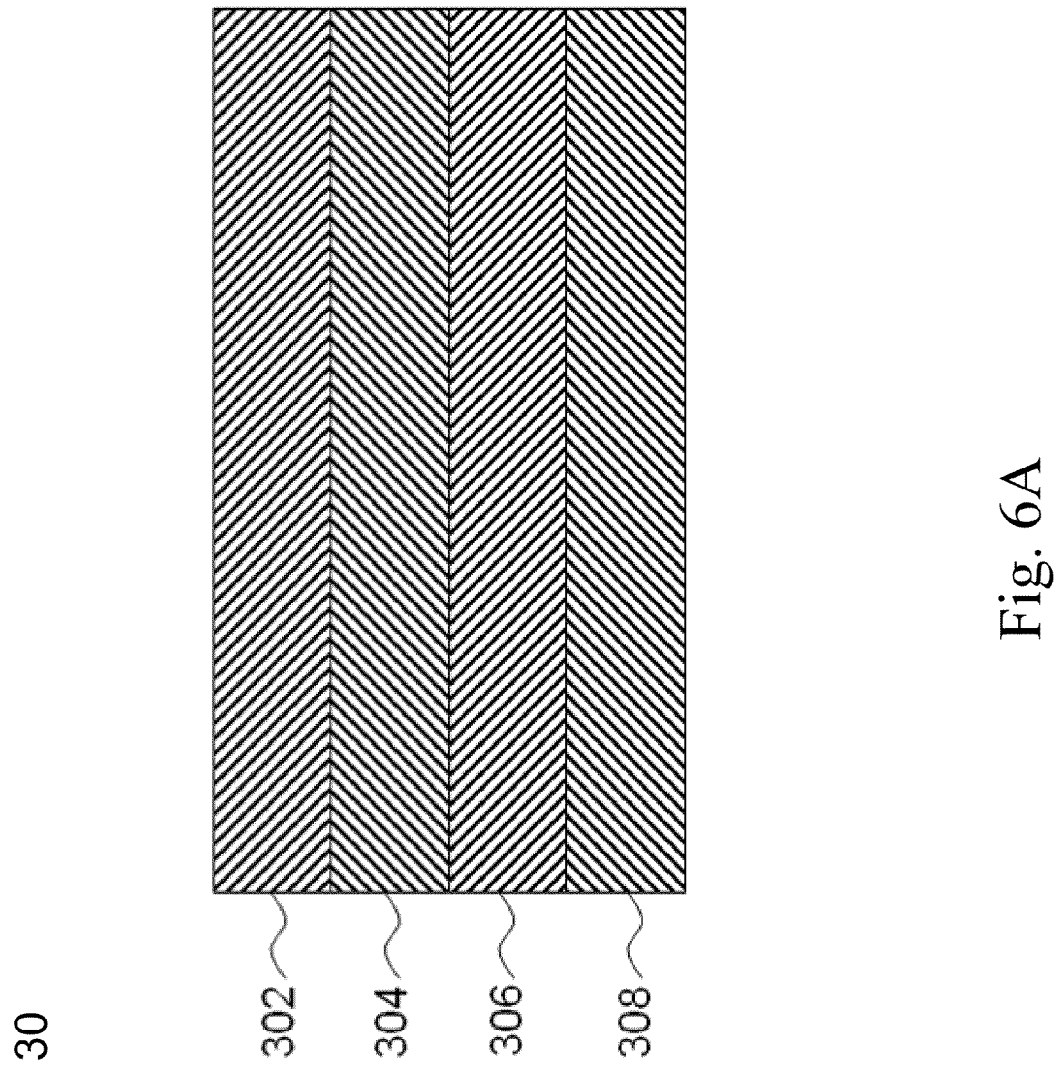
FIGS. 6A-6D illustrate a manufacturing process for patterning a light emitting diode according to a second embodiment of the present invention.
Figure 6B:
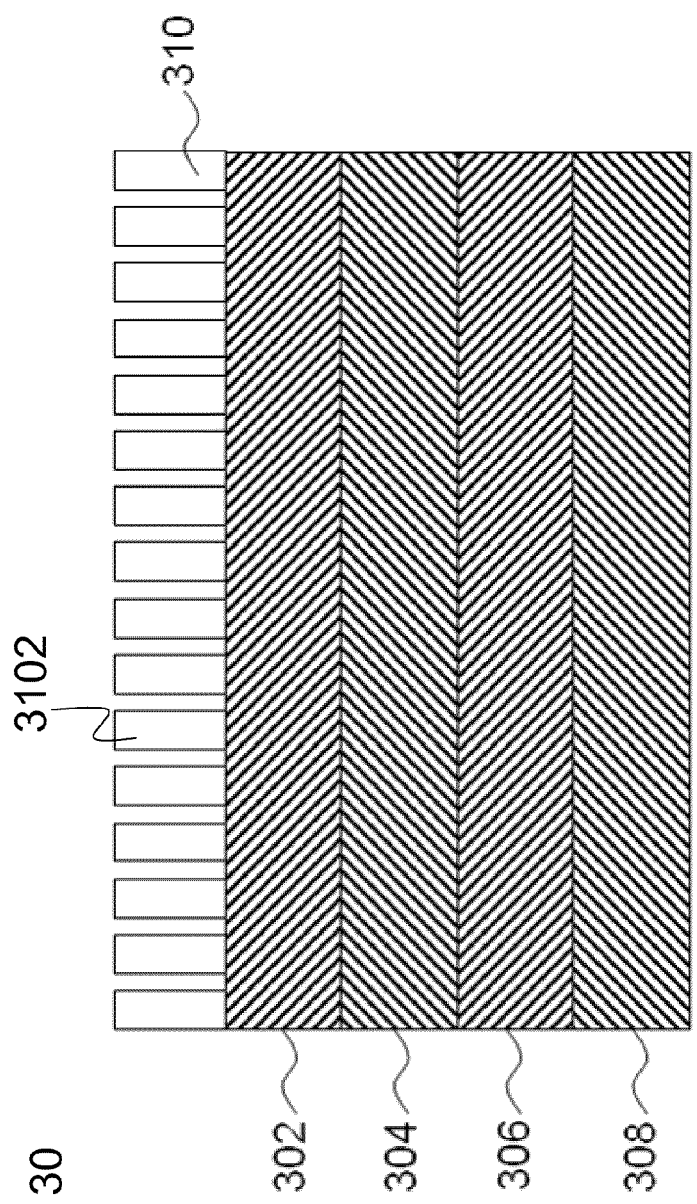
Figure 6C:
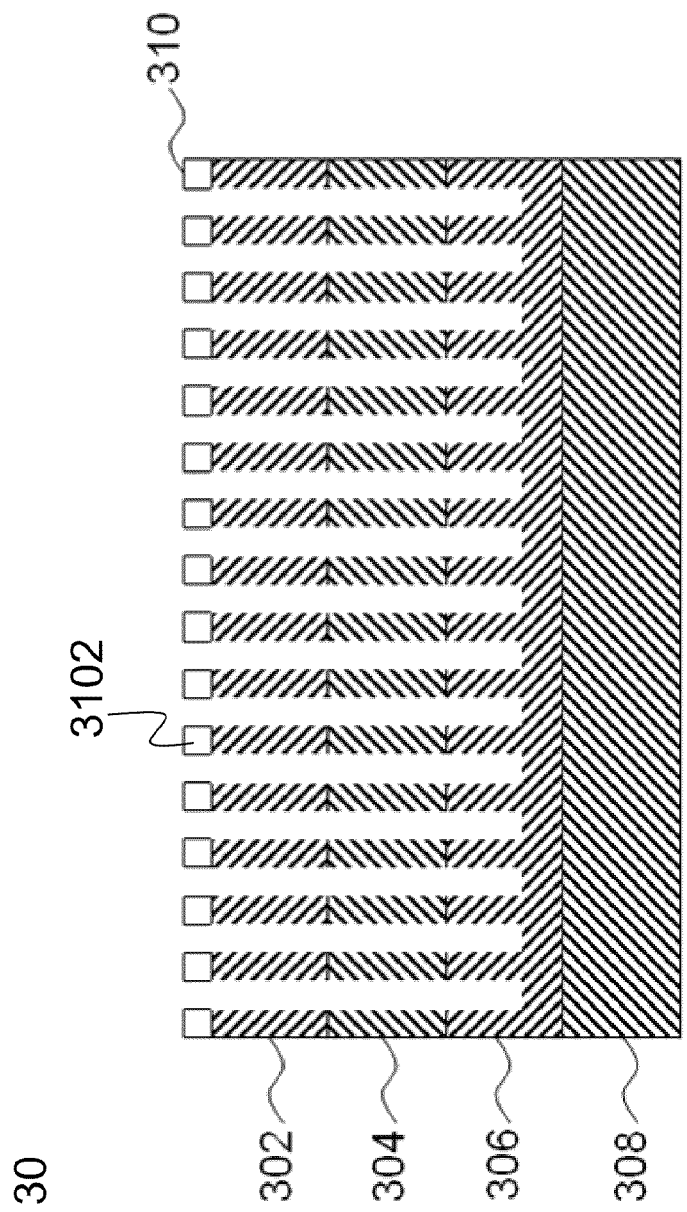
Figure 6D:
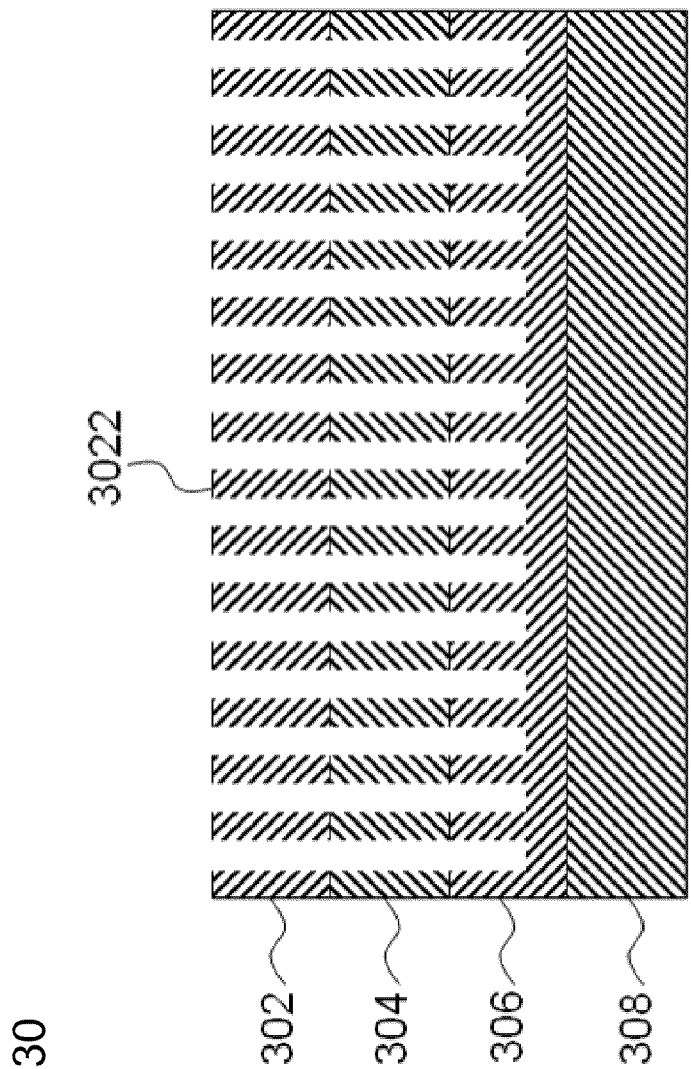
Figure 7A:
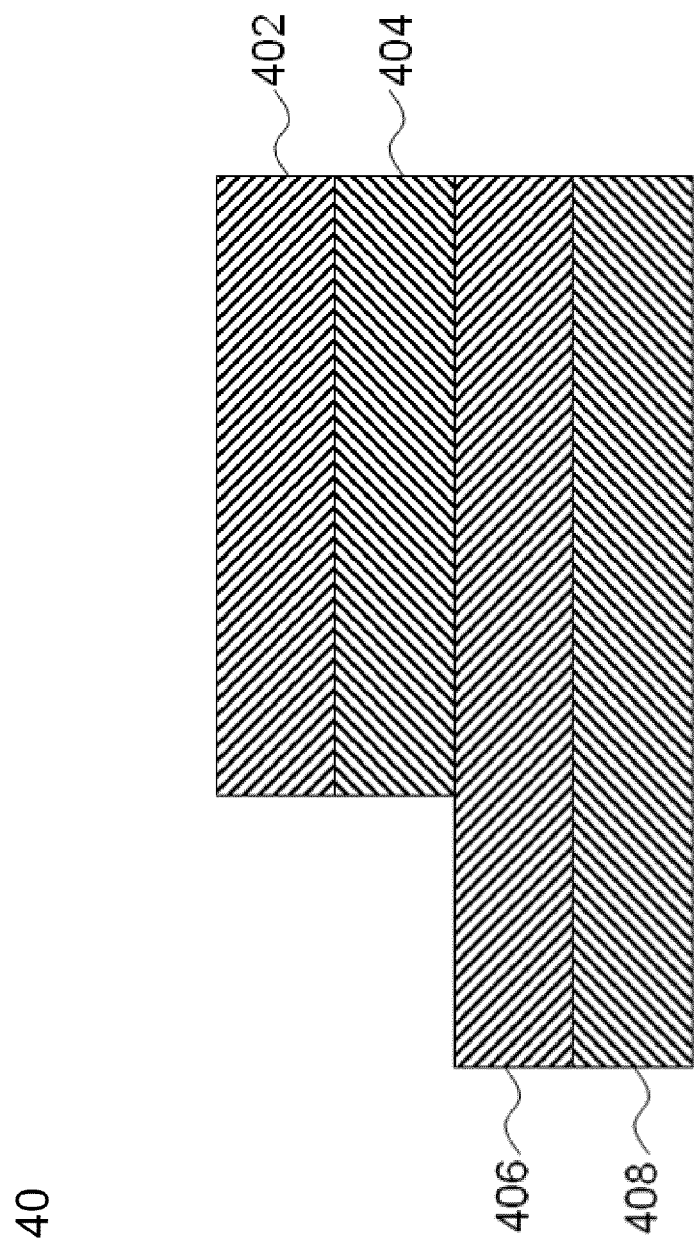
FIGS. 7A-7D illustrate a manufacturing process for patterning a light emitting diode according to a third embodiment of the present invention.
Figure 7B:
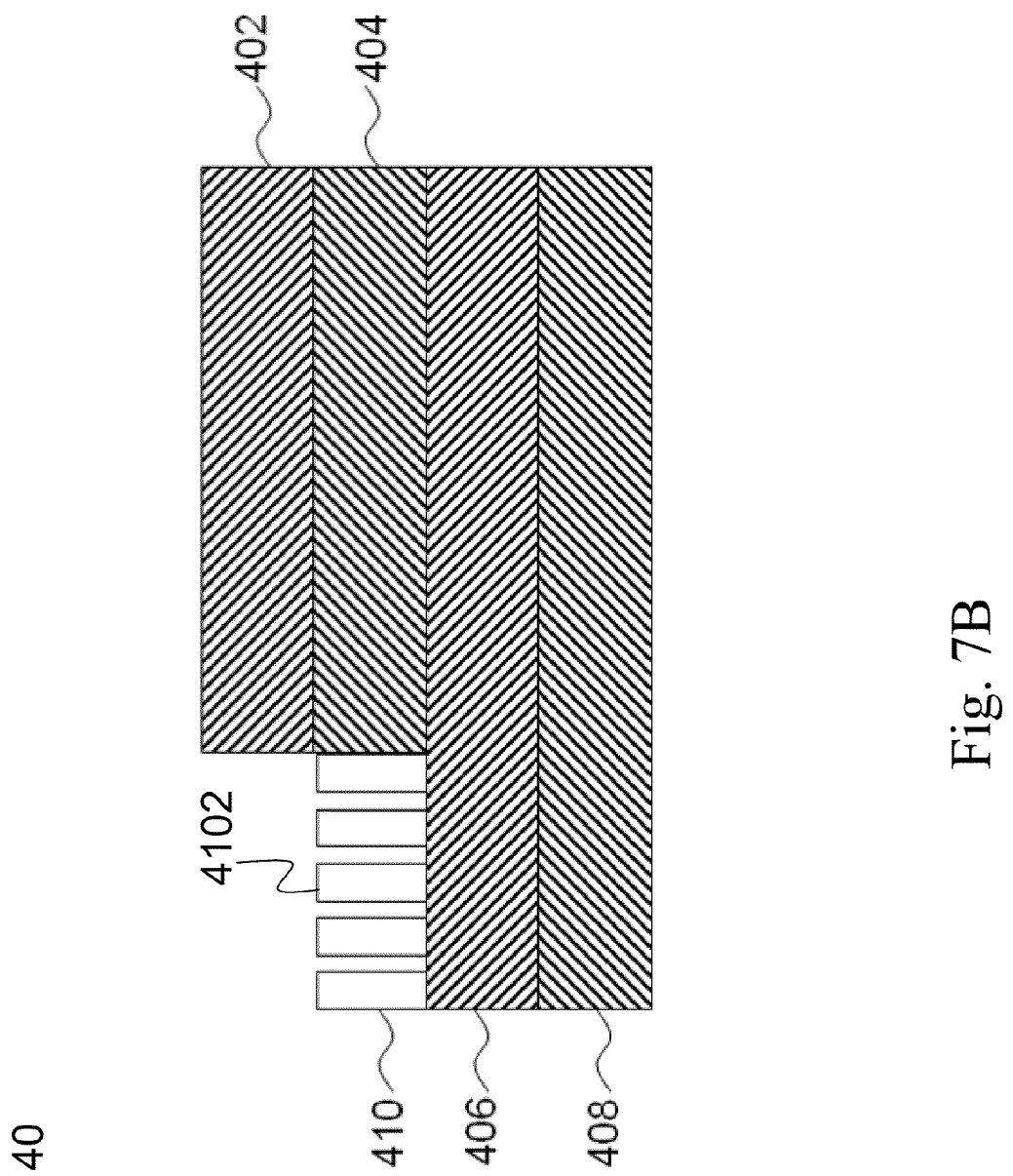
Figure 7C:
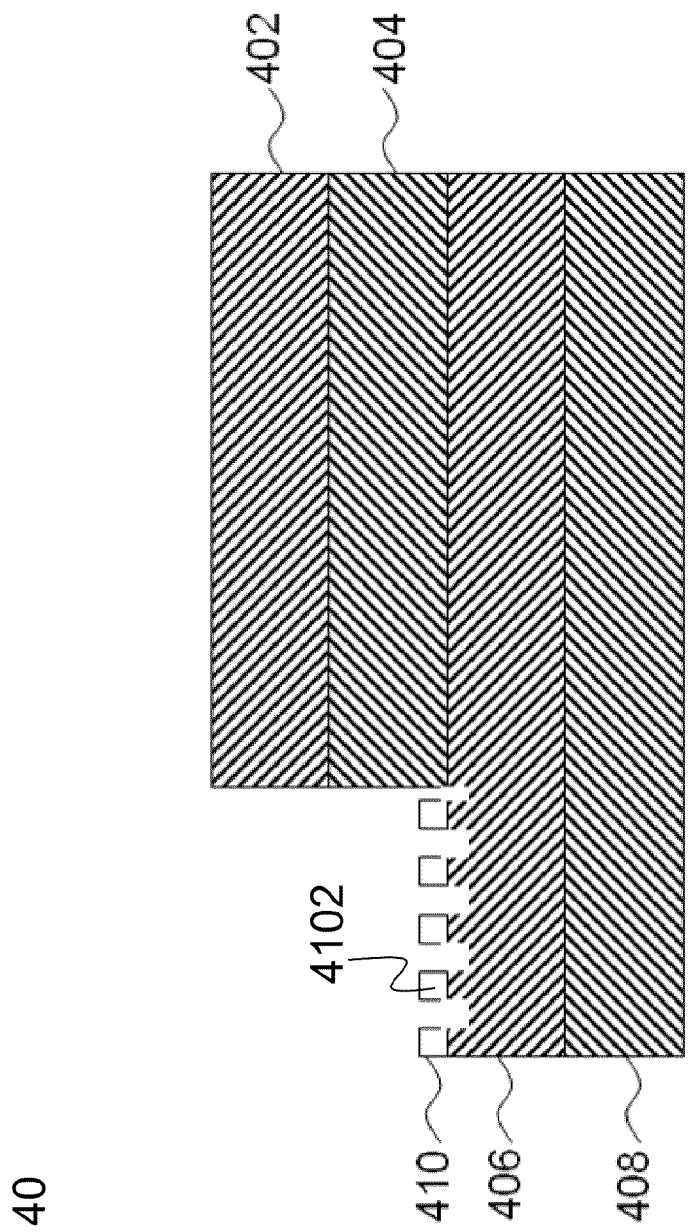
Figure 7D:
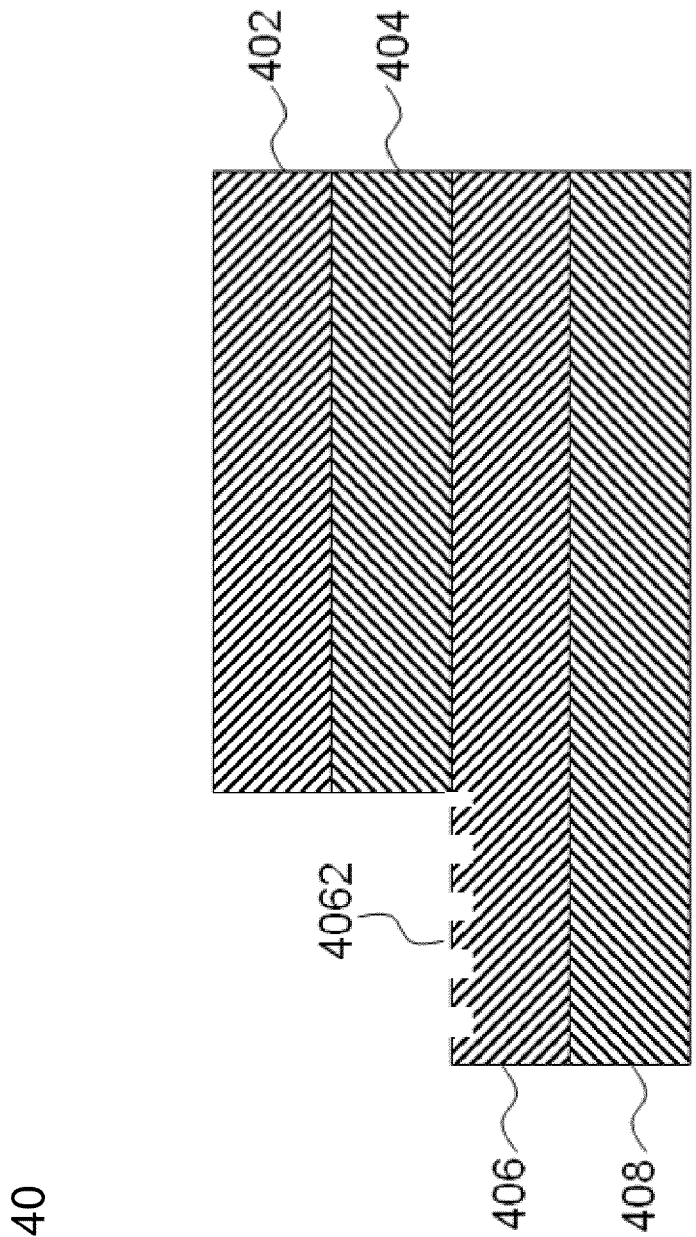

Please refer to FIG. 2 and FIGS. 3A-3D. FIG. 2 is a flow chart of patterning a light emitting diode for enhancing light extraction efficiency. First, a light emitting diode 20 is provided (as shown in step S101 in FIG. 2). As shown in FIG. 3A, the light emitting diode 20 includes from top to bottom a p-type layer 202, an active layer 204, a n-type layer 206 and a substrate 208. Although in this embodiment, the p-type layer 202 is formed on the active layer 204 and the n-type layer 206 is formed below the active layer 204, the p-type layer 202 and the n-type layer 206 can be exchanged. The active layer 204 has a quantum well structure. In practice, the active layer 204 can also have a homojunction structure or a heterojunction structure.

In this embodiment, the p-type layer 202 is selected on which a number of protrusions 2102 are grown to form a patterned oxide layer 210 (S102). The oxide layer 210 is formed by sol-gel method. The method is not limited to sol-gel method; it can be hydrothermal treatment, electro-plating, thermal evaporation, chemical vapor deposition (CVD), or molecular beam epitaxy (MBE).

The material used for the oxide layer 210 is calcium oxide (CaO). Of course, in practice, it can be indium tin oxide (ITO), al-doped zinc oxide (AZO), silicon dioxide ($SiO_2$), zinc oxide (ZnO), magnesium oxide (MgO), molybdenum oxide (MoO), aluminum oxide ($Al_2O_3$), titanium dioxide ($TiO_2$), nickel oxide (NiO), tin dioxide ($SnO_2$), barium oxide (BaO), manganese oxide (MnO), copper oxide (CuO) or a mixture of the materials mentioned above.

As to the oxide layer 210, the protrusions 2102 are micro-scaled to nano-scaled columns. Please see FIGS. 4A-4D. With different methods used for growing the oxide layer 210, the protrusions 2102 can be shaped as a hexagonal pyramid, a truncated hexagonal pyramid or a hexagonal cylinder.

The height of the protrusions 2102 can be controlled to achieve a desired etching depth of the light emitting diode 20 (S103). Next, a dry etching process is performed on the light emitting diode 20 through a portion of the light emitting diode 20 which is not protected by the patterned oxide layer 210 to form a lot of depressions on the light emitting diode 20 (S104). When etching takes place, the portions which are not covered by the protrusions 2102 will be etched away. At the same time, the protrusions 2102 will be etched. When the protrusions 2102 are removed by etching process, the uncovered portions are etched to the desired depth. The higher the protrusions 2102 are, the deeper the etched depth will be. According to the present invention, distance between every two adjacent protrusions 2102 is less than 1 micrometer.

In this embodiment, plasma etching is used. Of course, it can be replaced by inductively coupled plasma (ICP) etching, ion beam etching or reactive ion etching depending on what is suitable for etching the material used in the oxide layer 210. When plasma keeps colliding with the protrusions 2102 and takes away the protrusions 2102 piece by piece, it also etches the light emitting diode 20. Please refer to FIG. 3C. After the dry etching process finishes, parts of the columns of the oxide layer 210 are gone by plasma colliding. The dry etching process makes depressions from the surface of the oxide layer 210.

Last, the oxide layer 210 is removed from the light emitting diode 20 (S105). The agents used in removing the oxide layer 210 can be hydrochloric acid, nitric acid or hydrogen peroxide. In the present invention, nitric acid is used to wash away calcium oxide on the surface of the n-type layer 206. A patterned surface 2022 is formed on the light emitting diode 20. Since the protrusions 2102 have diameters ranging from 1 nm to 10 μm, the patterned light emitting diode 20 may correspondingly form a number of convexes which also have diameters ranging from 1 nm to 10 μm. The pattern surface 2022 allows light beams generated from the active layer 204 to be emitted out more easily via the depressions, thereby improving light extraction efficiency of the light emitting diode 20.

Second Embodiment

Please refer to FIGS. 6A-6D. A light emitting diode 30 has a p-type layer 302, an active layer 304, a n-type layer 306 and a substrate 308. In this embodiment, the active layer 304 has a quantum well structure.

An oxide layer 310 made of calcium oxide protrusions 3102 are formed on the p-type layer 302. In this embodiment, the thickness of the oxide layer 310 is thicker than that of the oxide layer 210 in the first embodiment. Therefore, when a dry etching process (such as inductively coupled plasma etching) is applied onto the oxide layer 310, a depression caused by the dry etching process is formed. In comparison with the first embodiment, depth of the depression can extend to the n-type layer 306 via the p-type layer 302 and the active layer 304.

After removing process with nitric acid, a patterned surface 3022 is formed on the light emitting diode 30. Since the light emitting diode 30 in this embodiment is etched to the n-type layer 306, light extraction efficiency thereof is much better than that of the first embodiment.

In this embodiment, time needed to make deeper depression is longer than that in the first embodiment. Because inductively coupled plasma etching has poor etching ability for the oxide layer 310, before the oxide layer 310 is etched to a desired level, the deeper depression has already formed. In summary, depth of the depression can be controlled by thickness of the oxide layer 310 and reaction time for dry etching. Besides, when etching reaction passes by, distance between the protrusions 3102 is enlarged. It means that the pattern can be controlled by thickness of the oxide layer 310 or time for dry etching.

Third Embodiment

For certain light emitting diodes, in order to easily form a pair of contacts thereon, a portion of the light emitting diode will be etched. Under this situation, the present invention is still applicable.

Please see FIG. 7A to FIG. 7D. A light emitting diode 40 has a p-type layer 402, an active layer 404, a n-type layer 406 and a substrate 408. Since materials of respective components, method for etching and removing steps are fully disclosed in the previous two embodiments, no more details are illustrated hereafter.

On the partially exposed n-type layer 406, an oxide layer 410 having several oxide protrusions 4102 is formed. The oxide layer 410 is not provided on the top surface of the p-type layer 402 of the light emitting diode 40. After etching and removing steps, the oxide layer 410 is removed. A n-type layer pattern 4062 is formed. The third embodiment shows that any specified region of the top surface of a light emitting diode can be patterned to enhance light extraction efficiency if etching process can apply to the region.

Fourth Embodiment

Figure 8:
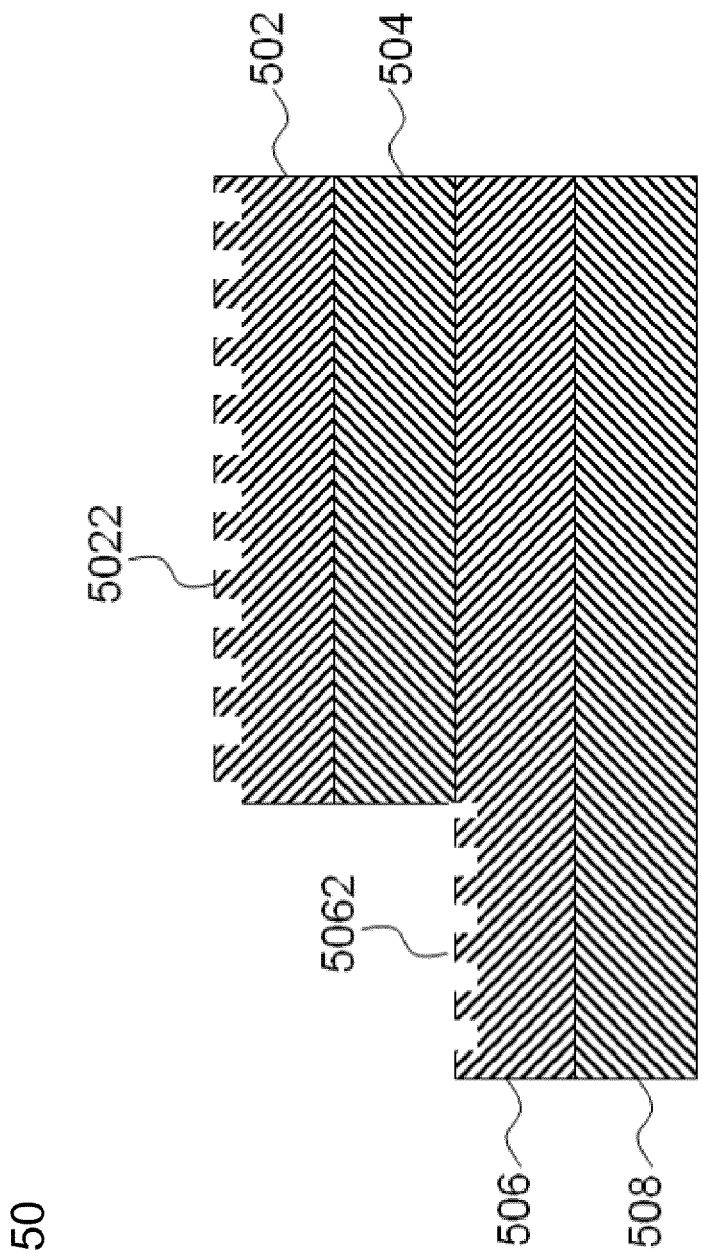
FIG. 8 illustrates a patterned light emitting diode according to a fourth embodiment of the present invention.

Please see FIG. 8. A light emitting diode 50 has a p-type layer 502, an active layer 504, a n-type layer 506 and a substrate 508. In contrast with the light emitting diode 40 in the third embodiment, the light emitting diode 50 has an exposed n-type layer 506. After growing an oxide layer, dry etching the light emitting diode 50, and removing the residual oxide layer, a n-type layer pattern 5062 and a p-type layer pattern 5022 are formed on the surfaces of the n-type layer 506 and p-type layer 502, respectively. In the end, the top surface of the light emitting diode 50 is patterned regardless of its elevation.

Fifth Embodiment

In some conditions, a second etching process can be used to deepen the depressions of the light emitting diode so that different light extraction efficiencies can be achieved.

Figure 9A:
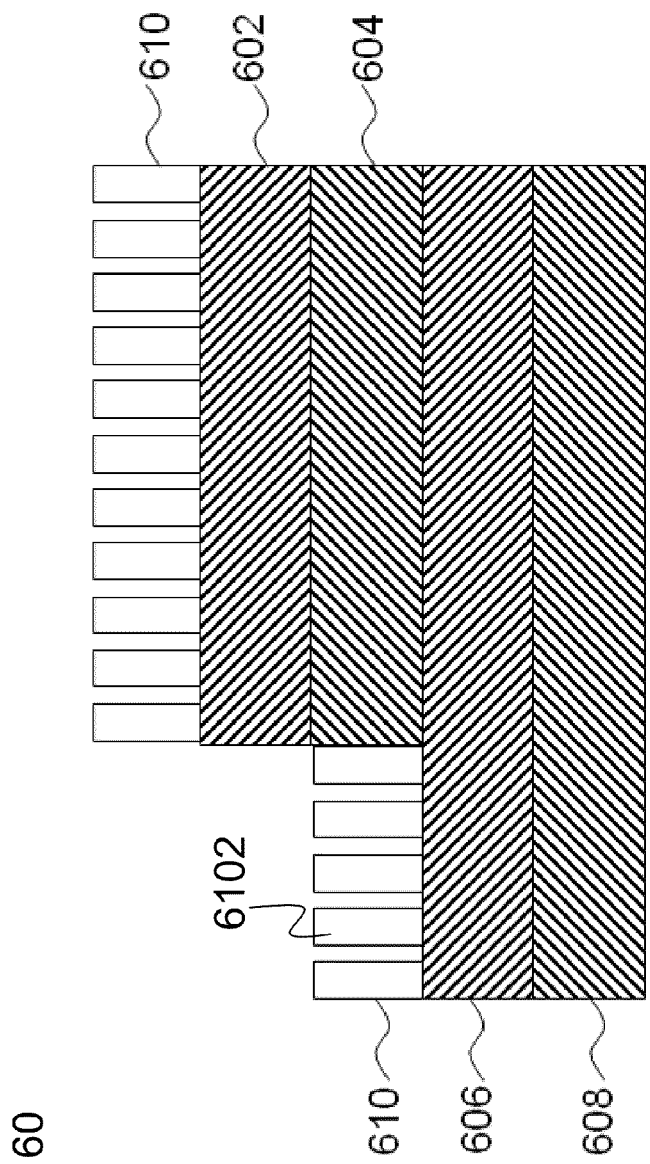
FIGS. 9A-9D illustrate a manufacturing process for patterning a light emitting diode according to a fifth embodiment of the present invention.
Figure 9B:
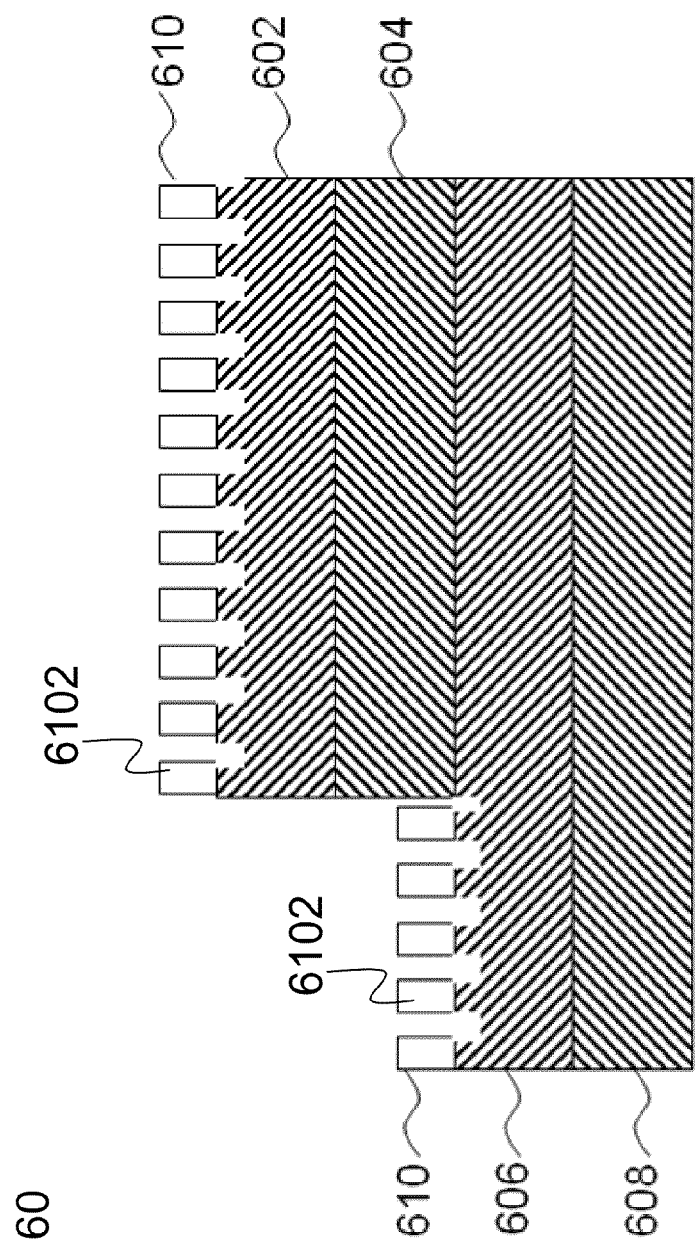

Please refer to FIG. 9A to FIG. 9D. A light emitting diode 60 has a p-type layer 602, an active layer 604, a n-type layer 606 and a substrate 608. In contrast with the light emitting diode 40 in the third embodiment, the light emitting diode 60 has an exposed n-type layer 606. An oxide layer 610 with protrusions 6102 is formed over the top surface of the light emitting diode 60. As shown in FIG. 9B, after a first dry etching process is completed, thickness of the oxide layer 610 is decreased. The distance between each protrusion 6102 is increased. Depth of depression caused by the first dry etching is uniform.

Figure 9C:
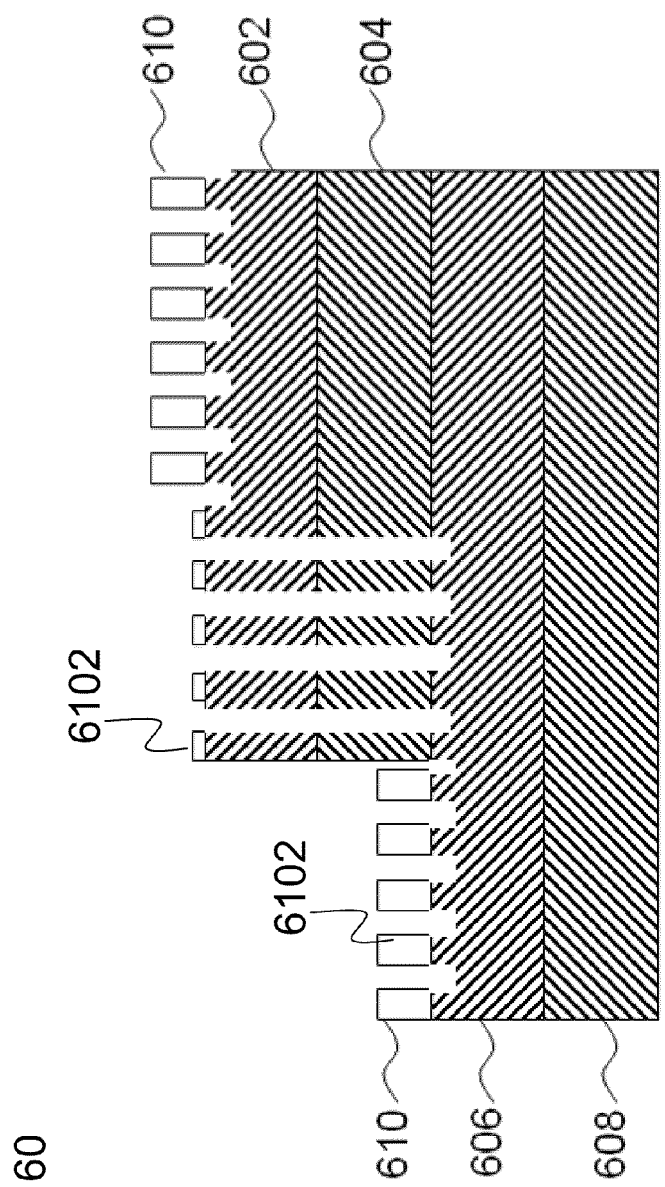
Figure 9D:
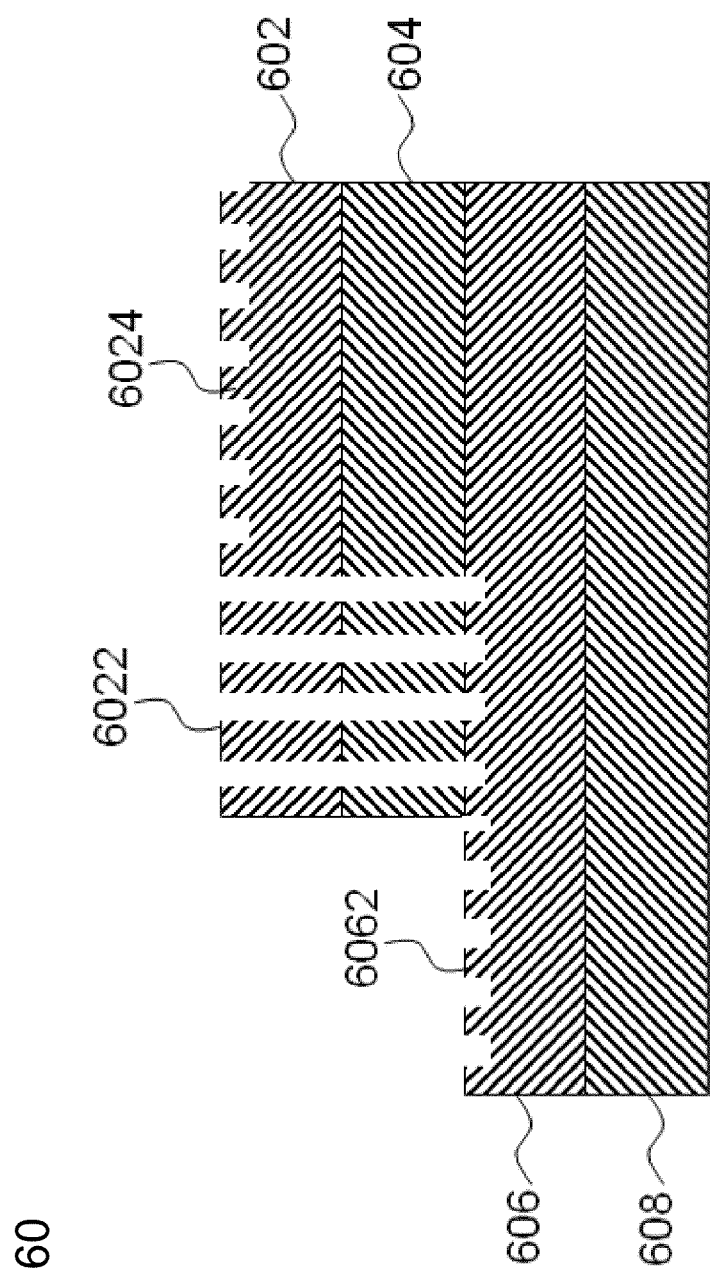

Now, the light emitting diode 60 is covered by a shelter (not shown) except the central portion. A second dry process is performed. As shown in FIG. 9C, the central portion of the light emitting diode 60 is etched deeper. After removing process, a n-type layer pattern surface 6062, a deeper p-type layer pattern surface 6022 and a shallow p-type layer pattern surface 6024 are formed as shown in FIG. 9D. Obviously, the deeper p-type layer pattern surface 6022 has better light extraction efficiency than others.

Sixth Embodiment

The oxide layer in the present invention is grown on side and top surfaces of the light emitting diode. Therefore, after etching and removing processes are finished, patterns can be obtained. If a light emitting diode has a sloped surface rather than a flat one, the present invention is still applicable.

Figure 10:
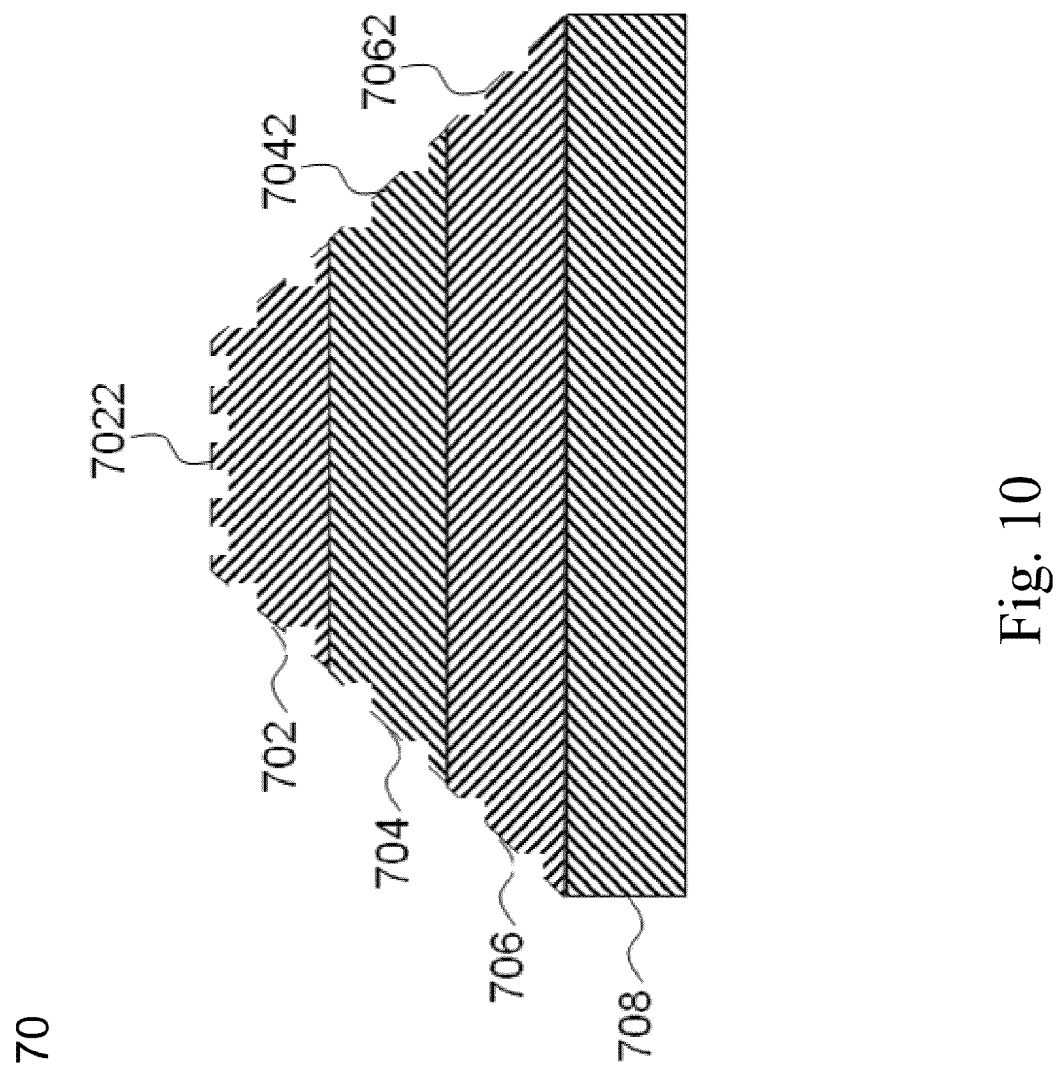
FIG. 10 illustrates a patterned light emitting diode according to a sixth embodiment of the present invention.

Please see FIG. 10. A light emitting diode 70 has a p-type layer 702, an active layer 704, a n-type layer 706 and a substrate 708. Two sides of the light emitting diode 70 are sloped. The cross-sectional shape thereof is wedge. In practice, cross-sectional shape of the light emitting diode can be rectangular or stepped as mentioned above.

After etching and removing processes, a p-type layer pattern surface 7022, an active layer pattern surface 7042 and a n-type layer pattern surface 7062 are formed. The patterns can be formed on the sloped surface. Even though the patterns are formed on the sloped surface, depressions caused by dry etching are still formed downwardly.

Seventh Embodiment

Figure 11:
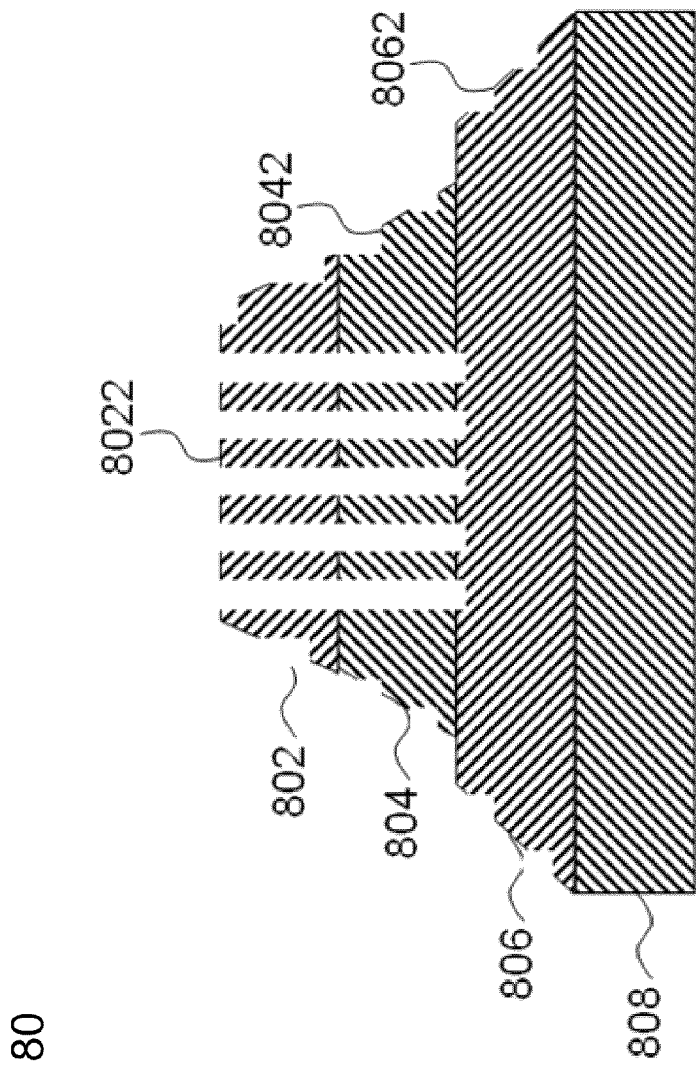
FIG. 11 illustrates a patterned light emitting diode according to a seventh embodiment of the present invention.

A combination of the fifth and sixth embodiments is disclosed. Please refer to FIG. 11. A light emitting diode 80 has a p-type layer 802, an active layer 804, a n-type layer 806 and a substrate 808. Two sides of the light emitting diode 80 are sloped.

By forming an oxide layer (not shown) over the light emitting diode 80, etching the two sides of the light emitting diode 80, etching the central portion of the light emitting diode 80 and removing the oxide layer, a p-type layer pattern surface 8022, an active layer pattern surface 8042 and a n-type layer pattern surface 8062 are formed. Obviously, the depression of the p-type layer pattern surface 8022 is much deeper after the second etching process.

Eighth Embodiment

Growing an oxide layer in different direction is disclosed in the last embodiment. Not only the top surface of a light emitting diode but also the side surfaces thereof can be formed with the oxide layer.

Figure 12A:
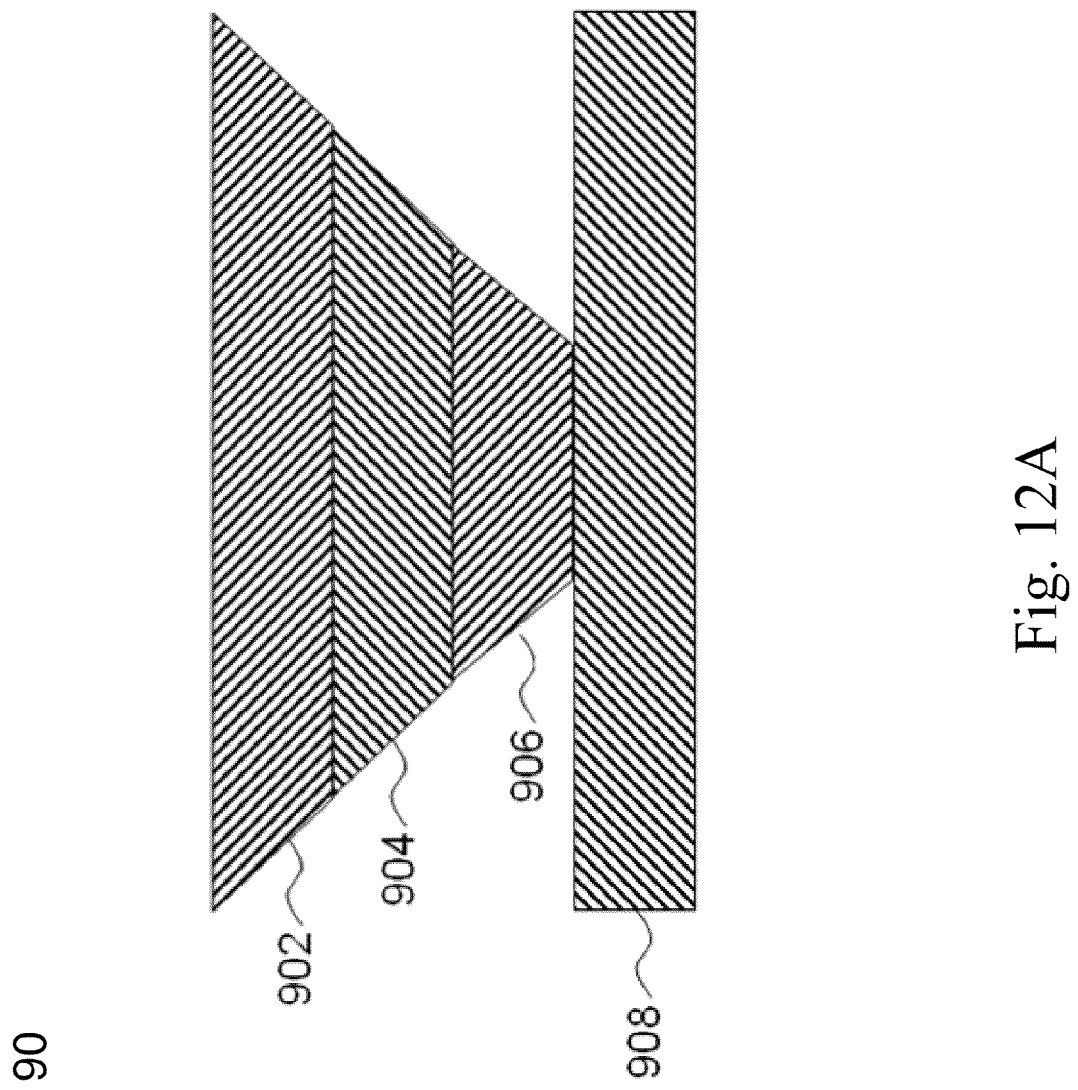
FIGS. 12A-12C illustrate a manufacturing process for patterning a light emitting diode according to an eighth embodiment of the present invention.
Figure 12B:
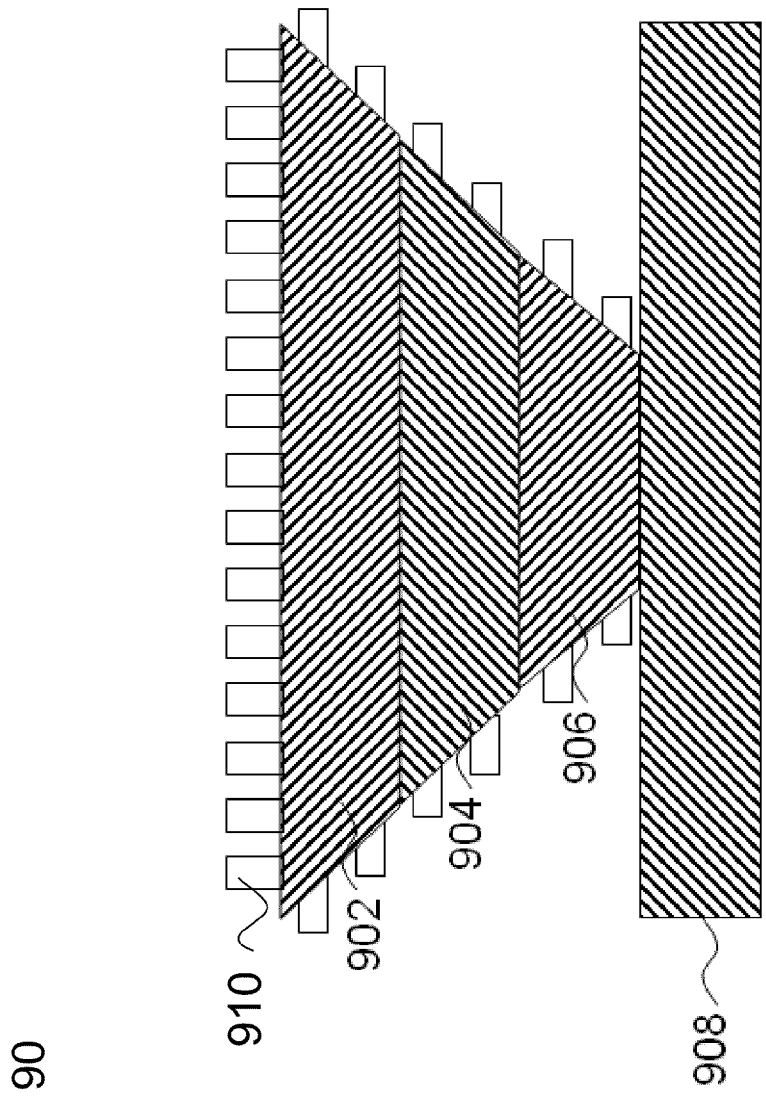
Figure 12C:
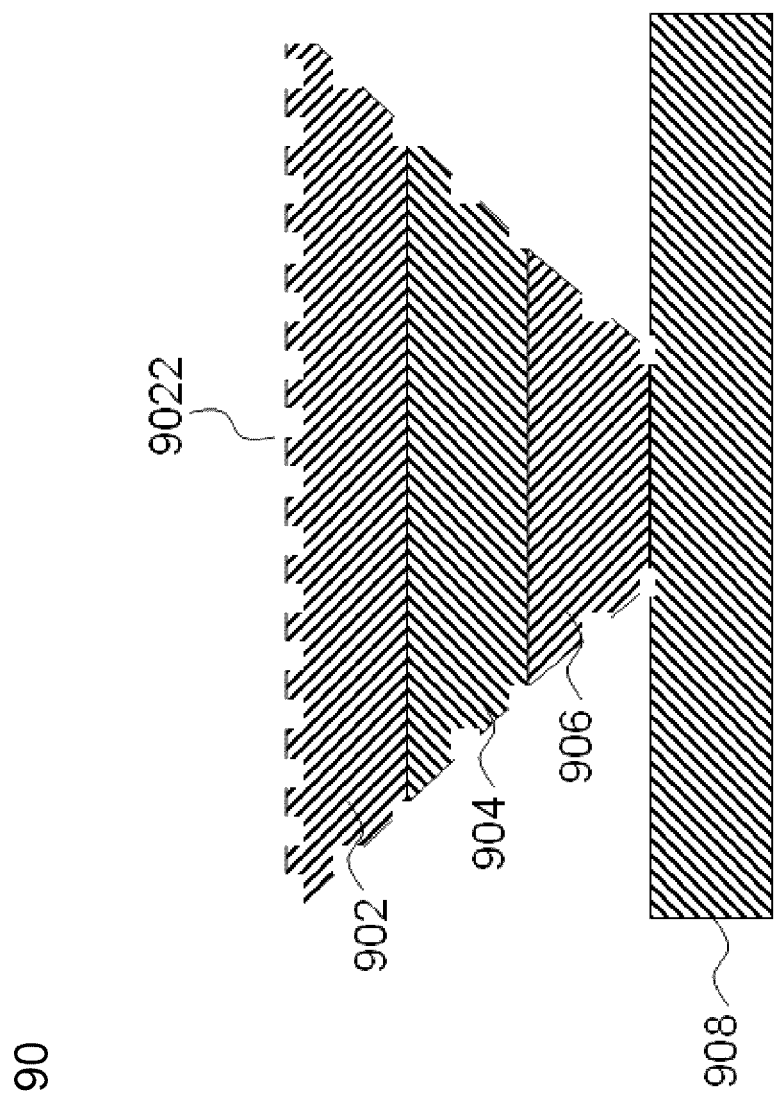

Please refer to FIG. 12A to FIG. 12C. A light emitting diode 90 has a p-type layer 902, an active layer 904, a n-type layer 906 and a substrate 908. Different from the light emitting diodes mentioned in the other embodiments, the light emitting diode 90 is dry etched to remove its two sides. The shape of the p-type layer 902, the active layer 904 and the n-type layer 906 is a reverse wedge. In order to enhance light extraction efficiency, top and side surfaces of the light emitting diode 90 need to be patterned.

Figure 13A:
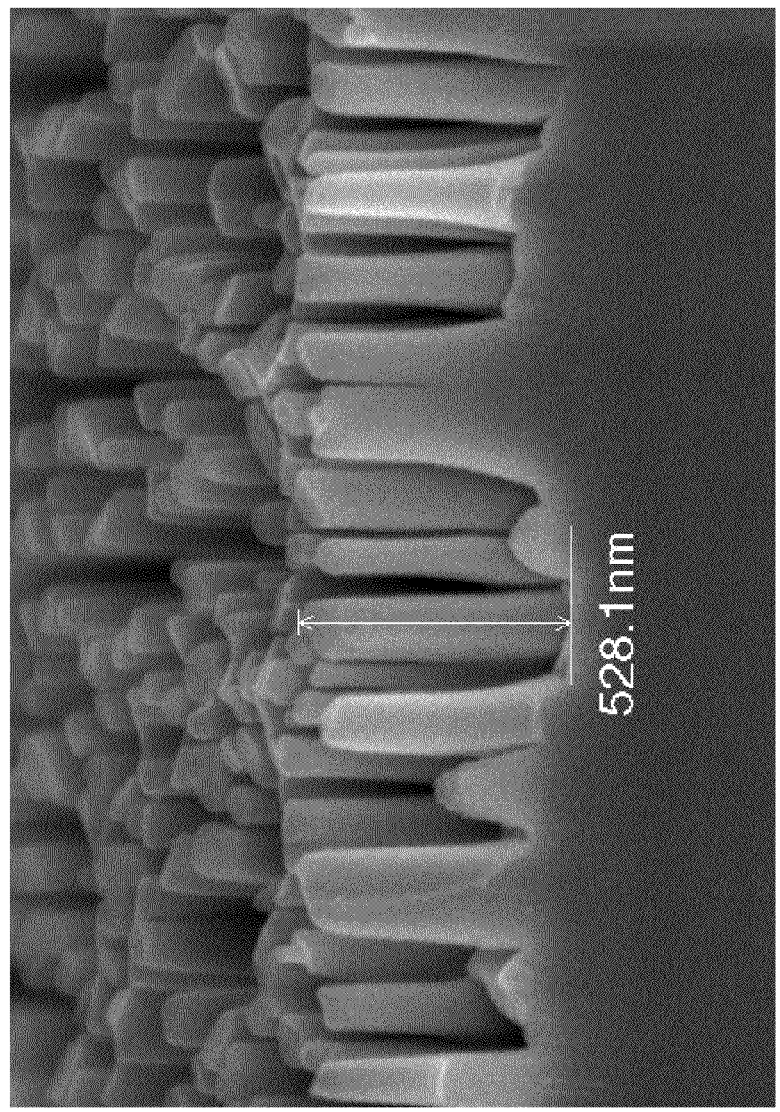
FIGS. 13A-13B illustrate scanning electron microscope (SEM) images showing a light emitting diode having protrusions formed thereon.
Figure 13B:
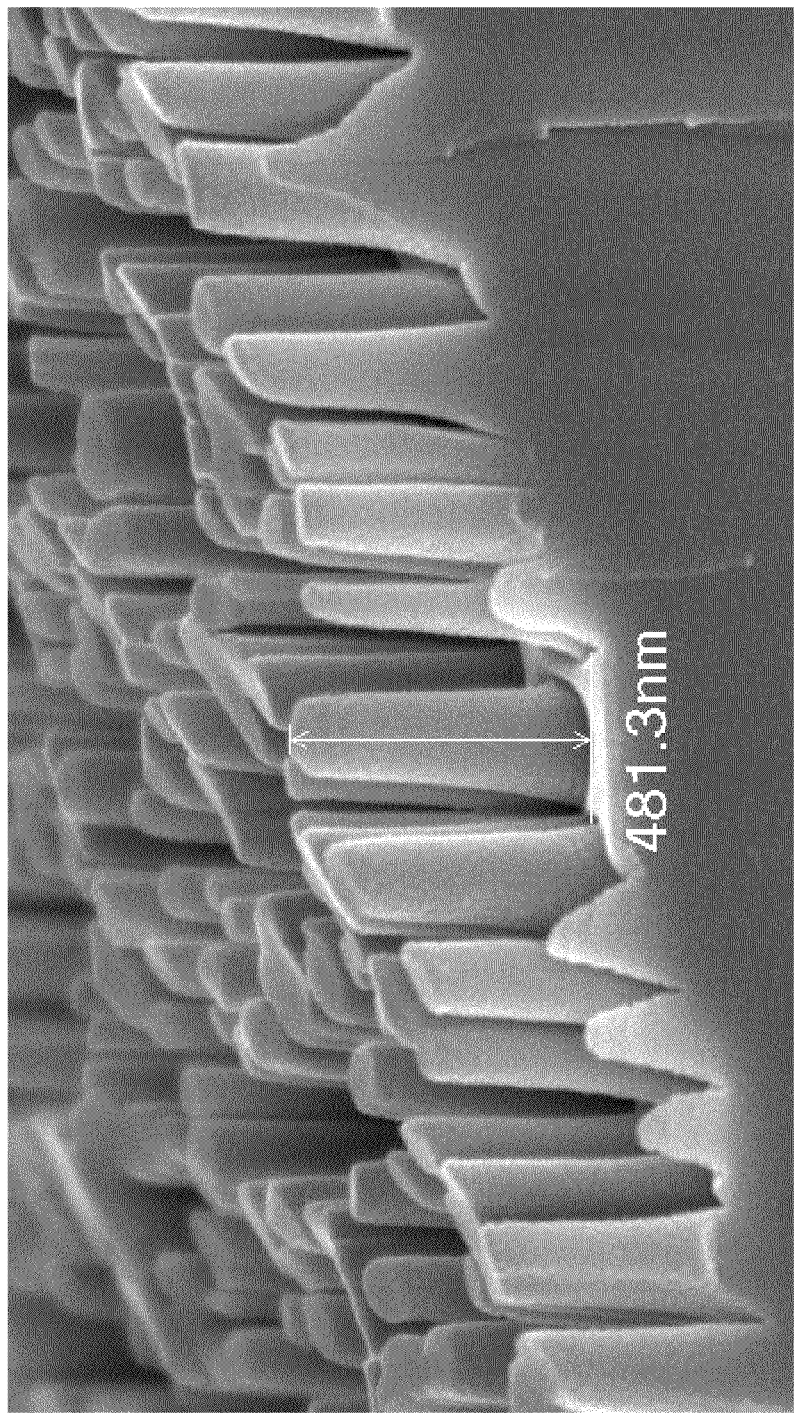

Please see FIG. 12B. An oxide layer 910 covers the surfaces mentioned above. It should be noticed that oxide on the side surfaces, as shown in FIG. 13A, can be formed along with that on the top surface, as shown in FIG. 13B, at the same time. When dry etching is performed, etching particles should collide with the oxide layer 910 from the top and sides. After removing process, a pattern surface 9022 exits on the whole light emitting diode 90 except the substrate 908.

In the aforementioned embodiments, although the p-type layer is formed on the active layer and the n-type layer is formed below the active layer, the p-type layer and the n-type layer can be exchanged.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for enhancing light extraction efficiency of a light emitting diode, comprising the steps of:
   a) providing a light emitting diode including in sequence a substrate, a first layer of a first conduction type, an active layer, and a second layer of a second conduction type opposite to the first conduction type;
   b) growing a plurality of protrusions on at least one layer selected from the first layer, the active layer, and the second layer of the light emitting diode to form a patterned oxide layer for protecting the light emitting diode from being etched;
   c) controlling height of the protrusions to achieve a predetermined etching depth of the light emitting diode;
   d) dry etching through a portion of the light emitting diode which is not protected by the patterned oxide layer to form a plurality of depressions on the light emitting diode; and
   e) removing the patterned oxide layer from the at least one layer by hydrochloric acid, nitric acid, or hydrogen peroxide.

2. The method according to claim 1, wherein the first conduction type is p-type and the second conduction type is n-type.

3. The method according to claim 1, wherein the active layer has a quantum well structure, a homojunction structure, or a heterojunction structure.

4. The method according to claim 1, wherein the patterned oxide layer is formed by hydrothermal treatment, sol-gel method, electro-plating, thermal evaporation, chemical vapor deposition (CVD), or molecular beam epitaxy (MBE).

5. The method according to claim 1, wherein the patterned oxide layer is made of indium tin oxide (ITO), Al-doped zinc oxide (AZO), zinc oxide (ZnO), magnesium oxide (MgO), molybdenum oxide (MoO), aluminum oxide ($Al_2O_3$), titanium dioxide ($TiO_2$), nickel oxide (NiO), calcium oxide (CaO), barium oxide (BaO), manganese oxide (MnO), copper oxide (CuO), tin dioxide ($SnO_2$), or a mixture thereof.

6. The method according to claim 1, wherein the protrusion has a shape of hexagonal pyramid, truncated hexagonal pyramid, or hexagonal cylinder.

7. The method according to claim 1, wherein the patterned oxide layer is at least partially formed on a top surface or a side surface of the light emitting diode.

8. The method according to claim 1, wherein the dry etching step is performed by plasma etching, inductively coupled plasma (ICP) etching, ion beam etching or reactive ion etching.

9. The method according to claim 1, wherein the protrusions have a diameter ranging from 1 nm to 10 μm.

10. The method according to claim 1, wherein the predetermined etching depth is achieved by controlling reaction time of the dry etching step.

11. The method according to claim 1, further comprising a step of d1) dry etching a portion of the oxide layer.

12. The method according to claim 1, wherein the light emitting diode has a cross-sectional shape of wedge, rectangle or step.

13. The method according to claim 1, wherein a distance between two adjacent protrusions is less than 1 micrometer.

* * * * *